United States Patent [19]
Kwasnick et al.

[11] Patent Number: 5,391,507
[45] Date of Patent: Feb. 21, 1995

[54] LIFT-OFF FABRICATION METHOD FOR SELF-ALIGNED THIN FILM TRANSISTORS

[75] Inventors: Robert F. Kwasnick; George E. Possin, both of Schenectady, N.Y.

[73] Assignee: General Electric Company, Schenectady, N.Y.

[21] Appl. No.: 115,973

[22] Filed: Sep. 3, 1993

[51] Int. Cl.$^6$ .................................. H01L 21/265
[52] U.S. Cl. ................... 437/41; 437/101; 437/187; 437/909; 437/944; 148/DIG. 100; 257/57; 257/59
[58] Field of Search .............. 437/40, 41, 101, 909, 437/944, 21, 187; 148/DIG. 100; 257/59, 57

[56] References Cited

U.S. PATENT DOCUMENTS

| | | | |
|---|---|---|---|
| 4,862,234 | 8/1989 | Koden | 357/23.7 |
| 4,935,792 | 6/1990 | Tanaka et al. | 357/23.7 |
| 5,010,027 | 4/1991 | Possin et al. | 437/41 |
| 5,153,142 | 10/1992 | Hsieh | 437/40 |
| 5,254,488 | 10/1993 | Haller | 437/40 |
| 5,281,546 | 1/1994 | Possin et al. | 437/40 |

FOREIGN PATENT DOCUMENTS 60-182134A 9/1985 Japan.

OTHER PUBLICATIONS

Semitransparent Silicide Electrode Formed on the Surface of a-Si:H, T. Tsukada et al., Mat. Res. Soc. Symp. Proc., Vol. 33, 1984, pp. 301–304.

Amorphous Silicon Thin-Film Transistors Modified by Doping and Plasma Treatment of the Nitride, Norbert Nickel et al., Mat. Res. Soc. Symp. Proc., Vol. 219, 1991, pp. 309–315.

K. Asama et al., "A Self-Alignment Processed a-Si TFT Matrix Circuit for LCD Panels," Fujitsu Laboratories, Ltd. Atsugi, Japan, SID Digest, 1983, pp. 144–145.

B. Diem et al., "a Si:H TFT: Potential Suitabilities for Gate and Source-Drain Self-Aligned Structure," Mat. Res. Soc. Symp. Proc., Vol. 33, 91984), pp. 281–285.

G. Possin et al., "Contact-Limited Behavior in Amorphous-Silicon FET for Applications to Matrix-Addressed Liquid-Crystal Displays," pp. 183–189, Proc. of the SID, Vol. 26/3, 1985.

Primary Examiner—Olik Chaudhuri
Assistant Examiner—Richard A. Booth
Attorney, Agent, or Firm—Donald S. Ingraham; Marvin Snyder

[57] ABSTRACT

A method of fabricating a self-aligned thin film transistor (TFT) with a lift-off technique includes the steps of forming a multi-tier island on a semiconductive layer such that the island structure is disposed in a desired alignment over the gate electrode. The island structure includes a base layer portion, an intermediate body portion, and an upper cap portion, which overhangs the intermediate body portion by an amount between about 0.5 $\mu$m and 1.5 $\mu$m. Source and drain electrodes are formed such that the source/drain material is disposed over the semiconductive material up to the sidewalls of the base portion of the island structure, which base portion is patterned such that the source and drain electrodes are self-aligned with and extend a selected overlap distance over the gate to provide desired TFT performance characteristics. The upper cap layer is removed in a lift-off technique and the intermediate body portion of the island is removed to complete fabrication oft the TFT.

25 Claims, 4 Drawing Sheets

LIFT-OFF FABRICATION METHOD FOR SELF-ALIGNED THIN FILM TRANSISTORS

RELATED APPLICATIONS AND PATENTS

This invention is related to the application of G. Possin et al. entitled "Self-Aligned Thin-Film Transistor Constructed Using Lift-Off Technique," Ser. No. 08/024,050, filed Mar. 1, 1993, and the application of R. Kwasnick et al. entitled "Self-Aligned Thin Film Transistor Constructed Using Lift-Off Technique," Ser. No. 08/043,043, filed Apr. 5, 1993, both of which are assigned to the assignee of the present invention and are incorporated herein by reference.

BACKGROUND OF THE INVENTION

This invention relates to the manufacture of thin-film field effect transistors, and in particular to a method of patterning the source and drain electrodes to have a desired alignment with the gate electrode.

In solid state electronic devices thin film field effect transistors (TFTs) are commonly used as switches. In particular, in imaging and display devices, a TFT is commonly associated with each pixel to enable a respective electrical signal to be coupled to or from each individual pixel. To maximize the active pixel area in an imager or display device, it is advantageous that the TFT be as small as possible. Further, the large number of pixels in an array require that the associated TFTs be relatively small so as to not require physically larger arrays. Additionally, array performance is improved as TFT size is decreased because total gate capacitance, gate to source capacitance, and gate to drain capacitance can be minimized.

The total gate capacitance should be small in order to reduce the total capacitance of the address line (e.g., a scan line) that control a row of TFTs in the imaging or display device. The charging time of the address line is controlled by the product of the line resistance and line capacitance. The total gate capacitance is added to the line capacitance in determining the address line charging time.

The gate to drain and gate to source capacitances, respectively, should be small to minimize the coupling capacitance between the input address line, which is connected to the gate, and imaging or display element connected to the source or drain.

A primary determinant of the gate to source and gate to drain capacitances is the overlap of the source and drain electrodes, respectively, over the gate electrode. Fabrication of small TFTs with the source and drain electrodes aligned over the gate electrode can be difficult. One reason is that photolithographic processes are commonly used to pattern the source and the drain electrode, and there is typically some positioning misalignment of about 2 microns or more that must be accounted for in device layout. This amount of misalignment requires that the regions where the gate overlaps the source and drain be made larger than otherwise required. These enlarged sizes to account for the misalignment result in increased gate to source and gate to drain capacitances as noted above.

Approaches to reducing this misalignment are found in U.S. Pat. No. 5,010,027, of G. Possin et al., and U.S. Pat. No. 5,156,986 of C. Wei et al., which are all assigned to the assignee of the present invention, and which are incorporated herein by reference.

One object of the present invention is to provide an improved fabrication process for TFTs having self-aligned source and drain electrodes.

Another object of the present invention is to provide a self-aligned lift-off method of fabricating a TFT that provides faster liftoff times.

SUMMARY OF THE INVENTION

A method of fabricating a self-aligned thin film transistor (TFT) using a lift-off technique includes the steps of forming a multi-tiered island on a layer of semiconductor material overlying a gate electrode such that a base portion of the multi-tiered island has dimensions corresponding to the desired overlap of the source and drain electrodes, forming source and drain electrodes having the desired overlap over the gate electrode, and removing all but the base portion of the multi-tier island. The multi-tiered island includes an inorganic dielectric material base layer, an organic dielectric material intermediate body layer, and a transparent conducting oxide upper cap layer, with the upper cap layer having a lip that overhangs the intermediate body layer by about 0.5 μm and 1.5 μm. The source and drain electrode material is deposited over the semiconductor material and the multi-tier island such that the electrode material is disposed over the semiconductor material and abuts the base layer of the multi-tier island; a portion of the underside of lip of the upper cap layer remains substantially free of the source and drain electrode material. In removing all but the base portion of the multi-tier island, the assembly is exposed to an etchant that is selective to the source-drain electrode material and such that the etchant is exposed to the underside of the lip of the upper cap layer to allow the upper cap layer to be etched away in a lift-off technique. The upper cap layer typically comprises indium tin oxide and the intermediate body layer typically comprises polyimide, and hydrochloric acid (HCl) is used as an etchant to effect the lift-off of the upper cap layer in a process that is accelerated as result of the hydrolization effect of the HCl at the polyimide/indium tin oxide interface.

BRIEF DESCRIPTION OF THE DRAWINGS

The features of the invention believed to be novel am set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1A:
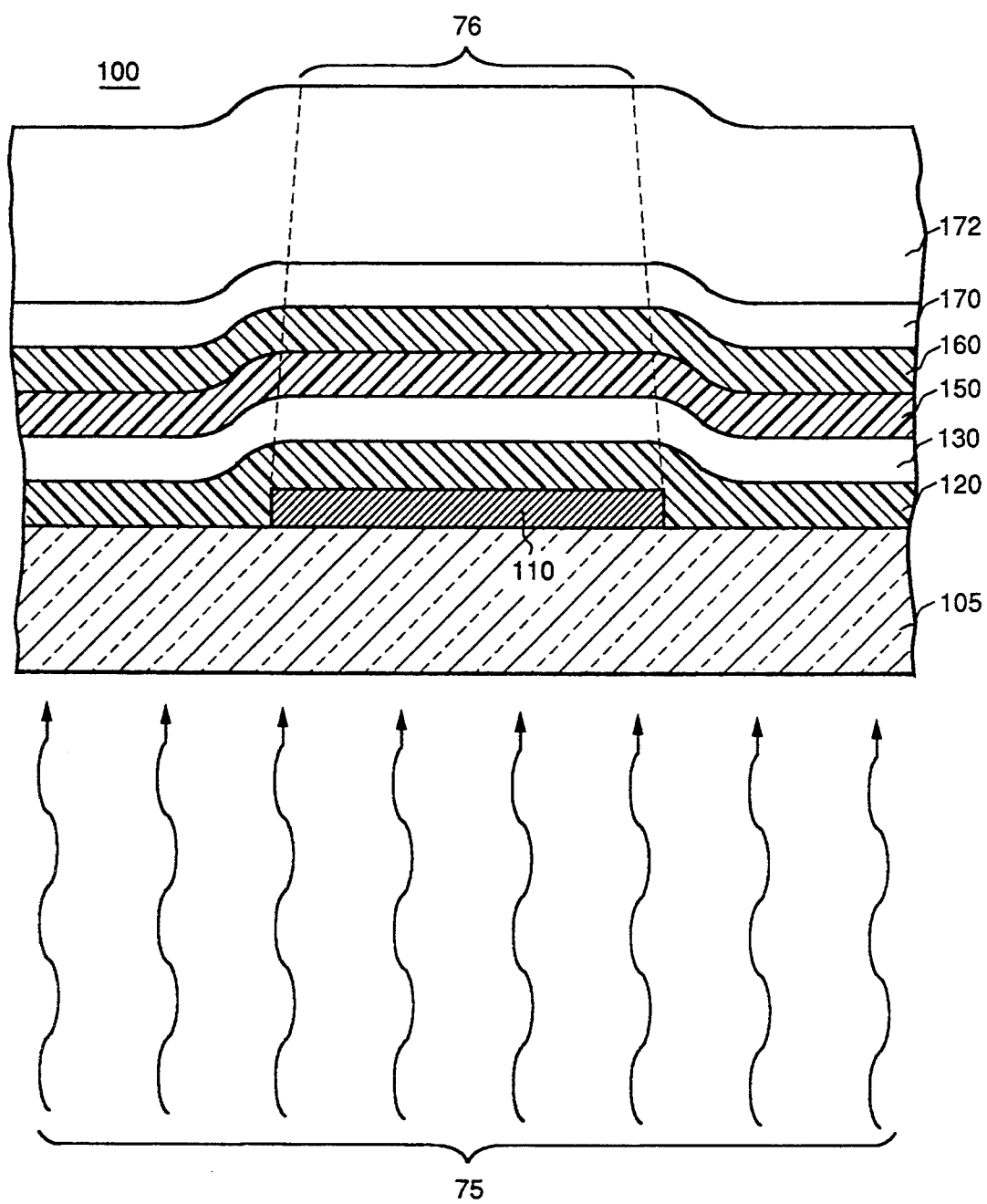
FIGS. 1 (A)–1(D) are a simplified representation of part of the sequence of steps used in constructing a TFT in accordance with the invention.

Fabrication of thin film transistors (TFTs) typically occurs through the deposition and patterning of various conductive, semiconductive, and insulative materials on a substrate. FIG. 1(A) illustrates a point in the fabrication process showing a TFT assembly 100 in which a gate electrode 110 has been formed on a substrate 105, such as can be accomplished using known techniques. As used herein, "TFT assembly" refers generally to the structure of the materials deposited and patterned to form the TFT at any point of the fabrication process. Substrate 105 typically comprises glass (such as Corning 7059 glass) or the like that is substantially transparent to light of wavelength in the ultraviolet range (e.g., 400 nm), which is used as described below for patterning portions of the device using a through the substrate exposure technique. Gate electrode 110 typically comprises a metal such as chromium, aluminum, tungsten, or the like, and alternatively may comprise one or more layers of a conductive material. The gate electrode typically has a thickness in a range of about 0.1 $\mu$m to 0.5 $\mu$m.

A gate dielectric layer 120 is deposited over substrate 105 and gate electrode 110. Gate dielectric layer typically comprises silicon nitride, silicon oxide or the like has a thickness in the range between about 50–500 nm. A semiconductor material layer 130 is deposited over gate dielectric layer, and typically comprises an amorphous semiconductor material such as amorphous silicon or the like having a thickness in the range between about 20 nm to 100 nm thick. Alternatively, polycrystalline silicon or cadmium sulfate (CdS) can be deposited as semiconductor material layer 130.

In accordance with this invention, a multi-tier island 140, as shown in FIG. 1 (D), is formed on semiconductor layer 130 over gate electrode 110. An inorganic dielectric layer 150 (FIG. 1(A)) comprising a substantially optically transparent material such as silicon nitride, or alternatively silicon oxide or similar PECVD-deposited dielectrics or the like, is deposited over semiconductor material layer 130 and has a thickness between about 100 nm and 1000 nm. It is generally desirable that inorganic dielectric layer 150 be thinner (within the range given above) if it will later be etched in a wet etch process (as described more fully below). Typically, gate dielectric layer 120, semiconductor material layer 130, and inorganic dielectric layer 150 are deposited by plasma enhanced chemical vapor deposition (PECVD) in a single vacuum pumpdown.

An organic dielectric layer 160 is deposited over inorganic dielectric material layer 150, and typically comprises polyimide (PI). The layer of PI film is typically spun on TFT assembly 100, and then annealed at temperatures up to about 250° C. The PI film typically has a thickness between about 200 nm to 1200 nm, and is substantially transparent to light having a wavelength in the ultraviolet range (e.g., 400 nm), which is used as described below for patterning portions of the device using a through the substrate exposure technique. One example of PI film having acceptable light transmission characteristics is Ciba-Geigy 293 polyimide; a layer having a thickness of about 500 nm has a transmission of about 80% for light in the 400 nm wavelength range A transparent conducting oxide layer 170 that is substantially light transmissive at the frequency of light used in the backside exposure technique is deposited over organic dielectric layer 160, such as by sputtering. Layer 170 typically comprises indium tin oxide (ITO) that has a thickness in the range between about 100 nm to 200 nm. An alternative transparent conducting oxide material that can be deposited is zinc oxide (ZnO). An ITO layer having a thickness between about 100 nm and 200 nm exhibits about 80% transmission of light having a wavelength about 400 nm.

Figure 1B:
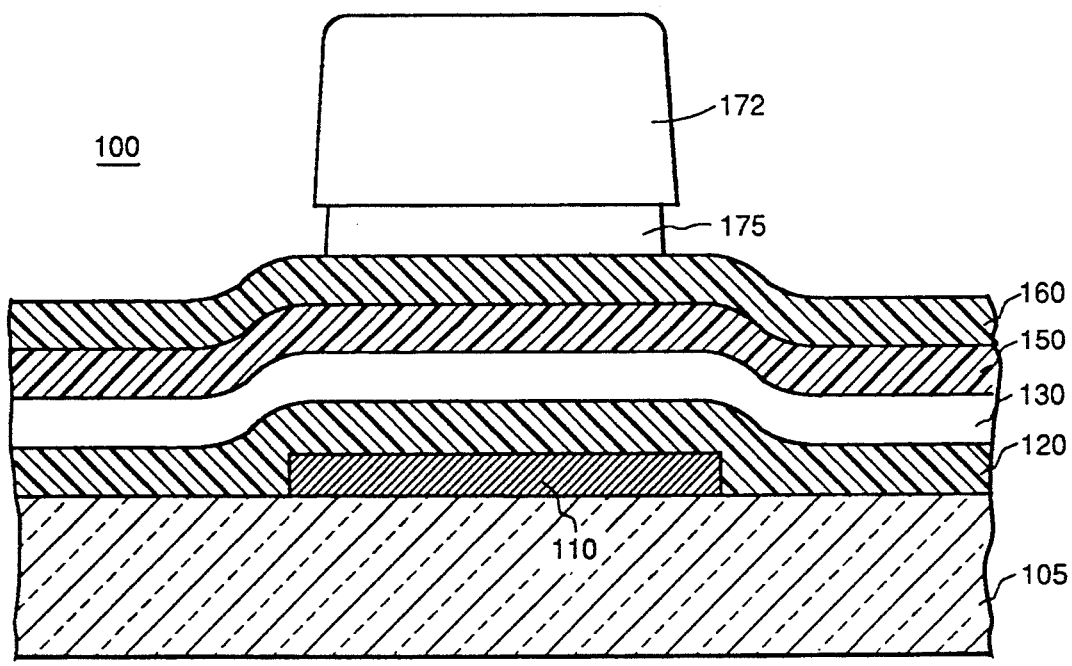
Figure 1C:
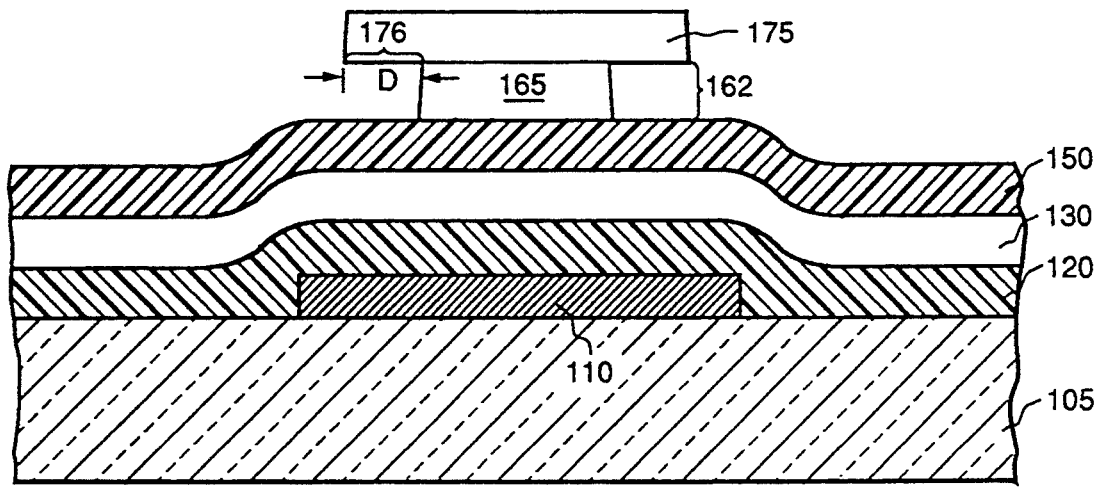
Figure 1D:
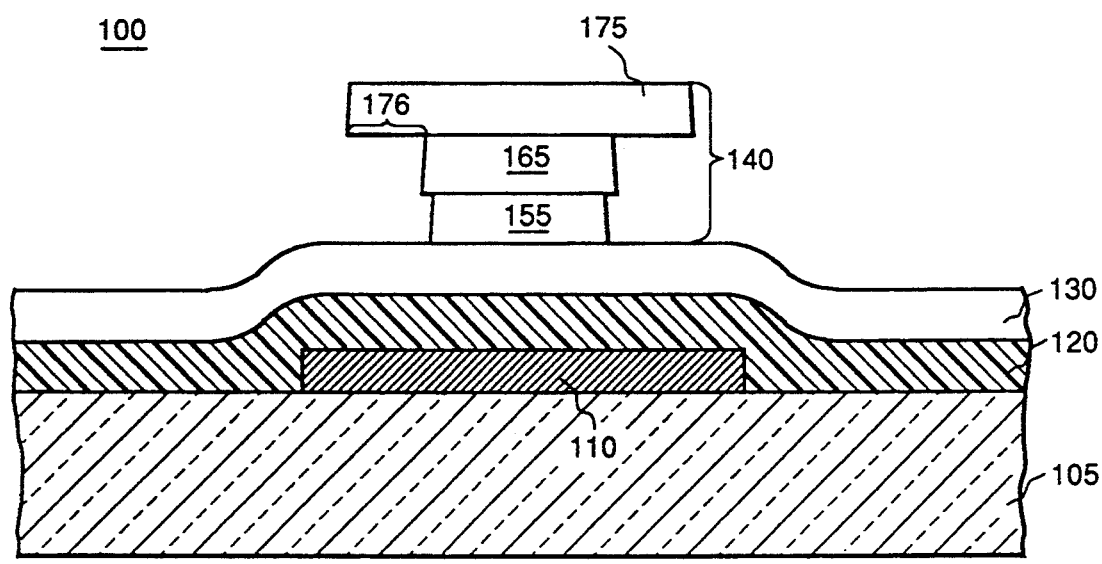

Transparent conducting oxide layer 170 is next patterned with a through-the-substrate (or backside) exposure technique to form upper cap layer 175 of multi-tier island 140 (FIG. 1(D)). A photoresist layer 172 is deposited over ITO layer 170 and assembly 100 is then exposed to light 75, typically ultraviolet light having a wavelength of about 400 nm, from a source on the side of substrate 105 opposite gate electrode 110, as illustrated in FIG. 1(A). The exposure time of the photoresist, using light sources of comparable intensity, must be longer for the backside exposure technique than with the conventional front side exposure to account for attenuation of the light in the layers of TFT assembly 100. The increase in exposure time for the TFT assembly of the present invention is somewhat longer than that required in the process of U.S. Pat. No. 5,010,027, for example, because of the presence of organic dielectric layer 160 and ITO layer 170, which collectively increase the exposure time by a factor of about 50% over that required for a TFT assembly without layers 160 and 170.

During the exposure step, gate 110 casts a shadow 76 on photoresist layer 172 within the region bounded by the dashed lines in FIG. 1(A). The exposed photoresist (that is, the area outside of the shadow) is developed and removed, leaving an unexposed portion of the photoresist corresponding to the area within shadow 76 on ITO layer 170 as a mask. ITO layer 170 is etched to remove the portion of the ITO not underlying the photoresist mask. The ITO is typically etched in a reactive ion etching process or alternatively in a wet etching process using, for example, oxalic acid. The etchant must be selective to organic dielectric layer 160; it should be noted that certain common wet etchants, such as hydrochloric acid, are not appropriate for use in this step as the HCl will degrade the underlying polyimide layer 160. Particularly in a wet etching process, some undercutting of ITO layer is common, but as long as such undercutting does not exceed 0.5 $\mu$m, it does not adversely affect the self-alignment process. TFT assembly 100 appears as illustrated in FIG. 1(B) at the conclusion of etching ITO layer 170. Remaining portions of photoresist layer 172 can then be stripped using a photoresist stripper (such as Ciba-Geigy photoresist stripper QZ3298, which does not attack the exposed PI material in layer 160). Alternatively, the residual photoresist can be stripped at a later point in the TFT fabrication process, such as prior to etching inorganic dielectric layer 150. The remaining portion of ITO layer comprises upper cap 175 of multi-tier island 140 (FIGS. 1(C) and 1(D)).

Polyimide layer 160 is next etched using the patterned ITO layer 170 (that is, upper cap 175) as a mask. Typically the etch process is an oxygen plasma etch, which is conducted for a selected time so as etch the PI from the exposed regions of TFT assembly 100 and further to create an undercut profile under upper cap 175. The etch is timed to provide an undercut region 162 (detailed in FIG. 1(C), but not necessarily with correct proportions). Undercut region 162 in which the PI has been etched away from underneath the ITO forms a lip 176 in upper cap layer 175. The amount of the undercut, or length "L" of the lip 176 is between about 0.5 $\mu$m and 1.5 $\mu$m. The remaining, or patterned, portions of PI layer 160 comprise intermediate body layer 165 of multi-tier island 140 (FIGS. 1(C) and 1(D)).

Inorganic dielectric layer 150 is next etched, using the overlying layers of PI and ITO as a mask. For example, silicon nitride, which typically comprises the inorganic dielectric material in layer 150, is etched in a wet etch process using hydrofluoric acid (HF) or buffered HF (BHF) using intermediate body layer 165 as a mask to remove the exposed portions of the silicon nitride. Alternatively, a dry etch process, for example using reactive ion etching, to etch the silicon nitride selective to the underlying semiconductive material layer 130, can be used, in which case ITO upper cap layer 175 acts as the primary mask to define the boundary (or sidewall) of the portion of silicon nitride layer 150 remaining after this etching step, which comprises base layer 155 of multi-tier island 140. The island structure illustrated in FIG. 1(D) illustrates a structure that would typically result from the use of the wet etch process, in which the dimensions of silicon nitride base layer 155 is defined primarily by the patterned PI forming the intermediate body layer 165 (some undercutting of base layer 155 may occur, but typically is quite minimal, e.g., less than about 0.5 μm). In any event, base portion is substantially centered over gate electrode 110 and has a lateral dimension corresponding to overlying layers of multi-tier island 140.

At this point in the fabrication process, multi-tier island 140 has been formed and appears as illustrated in FIG. 1(D). As noted above, the lateral dimension (i.e., in the plane of the paper of the Figures) of upper cap layer 175 is determined by the backside exposure technique; the lateral dimension intermediate body layer 165 is determined by the length of upper cap layer 175 and the timed etching of the PI to achieve an undercut of upper cap layer 175 with the desired dimensions (e.g., about 0.5 μm to 1.5 μm undercut); and the lateral dimension of base layer 155 is substantially the same as that of intermediate body layer 165. The lateral dimension of base layer 155 is thus determined by the backside exposure self-alignment technique. TFT assembly 100 is next prepared for the formation of the source and drain electrodes by cleaning the exposed surfaces in a brief (e.g., about 30 seconds) wet etch in diluted BHF (e.g., a 1% solution of the standard commercially-available HF solution).

Figure 2A:
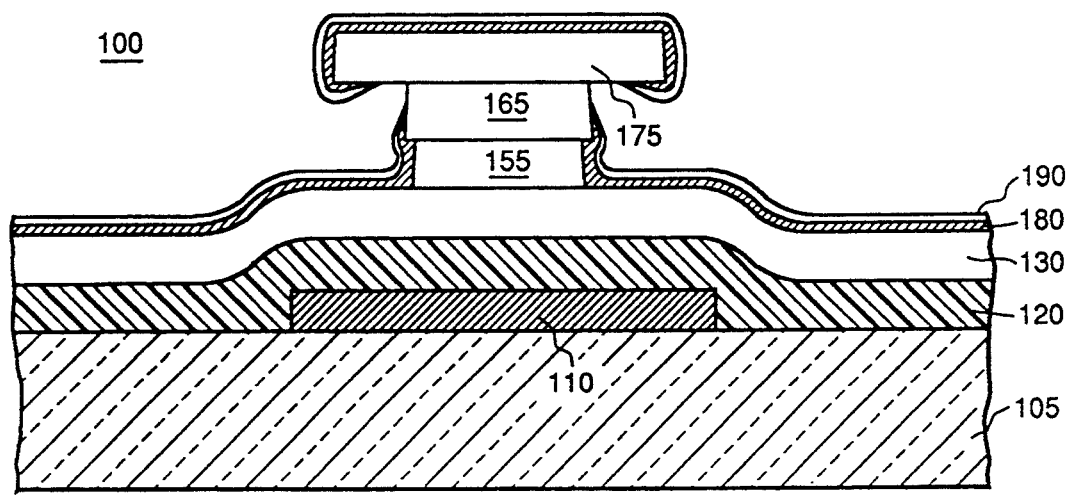
FIGS. 2(A)–2(B) are a simplified representation of the lift-off portion of the procedure of the present invention.
Figure 2B:
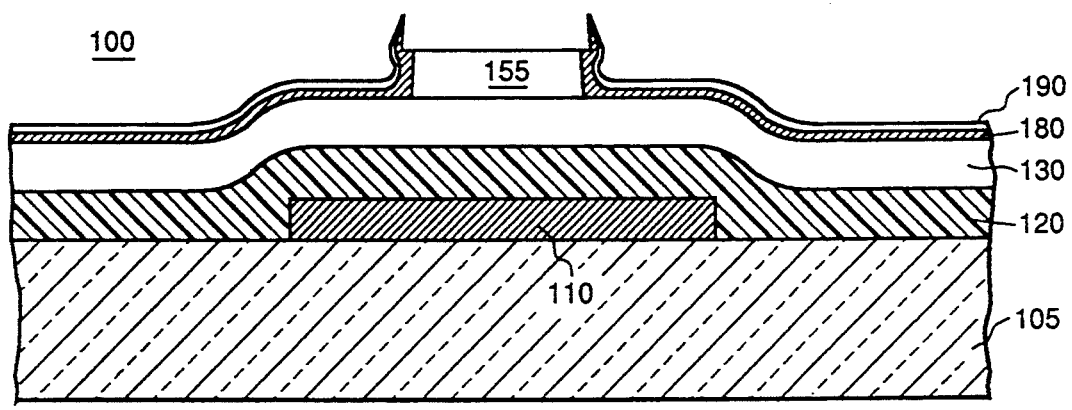

As illustrated in FIG. 2(A), source and drain electrodes are formed by the deposition over TFT assembly 100 of appropriate source-drain material to form the electrodes. Typically a layer of doped semiconductive material 180, e.g., silicon doped to exhibit n+ conductivity, is first deposited over TFT assembly 100. The doped semiconductive material comprises n+ amorphous silicon (n+Si) or, alternatively, n+microcrystalline silicon (n+μc-Si). The doped semiconductive material is deposited in a PECVD process and has a thickness in the range between about 10 nm and 100 nm. The doped semiconductive material covers the exposed regions amorphous silicon layer 130 and abuts the sidewalls of base layer 165 of multi-tier island 140; the deposition process further results in an accumulation of doped semiconductive material on the upper surface upper cap layer 175 and which, to some degree, may also wrap around the corner of lip 176; the doped semiconductive material tends to break at the edge of upper cap lip 176 so that substantially none of the material adheres to the underside surface of lip 176. As used herein, reference to "substantially none of the material adhering to the underside surface" and the like refer to little (e.g., 20 Å) or no accumulation of the deposited material on the underside such that in the lift-off process, as described below, the etchant applied to remove upper cap layer 175 readily penetrates any deposited material and gains access to the ITO/PI interface. The distance D of undercut under lip 176 is selected (e.g., through the timing of the PI etch) to ensure that the source-drain material deposition process substantially does in particular does not cover the corner at the interface between the ITO material of upper cap 175 and the PI of intermediate body layer 165.

In one embodiment of the invention, a relatively thin (e.g., 10 nm–50 nm) metallic conductive material layer 190 is then deposited, usually in a sputtering of evaporation process, over doped semiconductive material layer 180. As noted above, substantially none of the conductive material layer adheres to the underside of lip 176 of upper cap layer 175. At this stage of the fabrication process, TFT assembly 100 appears as illustrated in FIG. 2(A). The thickness of the metallic conductive layer is selected to reduce the combined lateral resistance of the doped semiconductive layer and the metallic conductive layer in the contact region of the TFT (that is, the region above gate electrode 110) so that it is small enough to provide good TFT performance. The doped semiconductive material and conductive material deposited over the amorphous silicon semiconductive layer 130 up to the sidewall of base layer 155 comprise the source electrode, and the doped semiconductive and conductive material deposited over the amorphous silicon semiconductive material 130 up to the opposite sidewall of base layer 155 comprises the drain electrode; the determination of which portion comprises the source electrode and which comprises the drain electrode is determined by the connections made to the respective electrodes and is not critical for the purposes of describing this invention. The lateral dimension of base portion 155, coupled with its substantially centered placement over gate electrode 110 (as determined by the backside exposure technique and the subsequent etching of ITO layer 170 and PI layer 160) determines the amount overlap of each the source and the drain electrodes over the gate electrode (and hence determines the respective gate to source and gate to drain capacitances).

Upper cap layer 175 (and the doped semiconductive material and metallic conductive material adhering thereto from the source/drain material deposition processes)is then removed from TFT assembly 100 with a lift-off technique by exposing the assembly to an etchant selective to the source/drain material. "Lift-off" refers to an etchant process in which the upper cap layer is detached from the underlying intermediate portion layer (and is removed from the TFT assembly in the etching process) prior to the upper cap layer structure being otherwise destroyed by the etchant, thus saving time by effecting the removal of the structure in less time than is required to etch away the material deposited on and forming upper cap layer 175.

In accordance with this invention, TFT assembly 100 is wet etched using hydrochloric acid (HCI), which not only etches ITO exposed at the underside of lip 176 of upper cap 175 but also hydrolizes the PI of intermediate body layer 165. This hydrolization of the PI results in a very rapid etch back of the ITO at the ITO-PI interface of upper cap layer 175 and intermediate body layer 165. The hydrolization of the PI degrades the structural integrity of the ITO/PI interface, providing faster access of the etchant to the ITO along the length of the interface, such that the etching covers several hundred microns in only a few minutes, resulting in a relatively quick "lifting off" of upper cap layer 175 from intermediate body layer 165. The breakdown of the structural integrity of the PI/ITO interface also enables the upper cap layer to be lifted-off sooner than would be possible if the ITO was being removed solely in the etching interactions.

As noted above, the etchant applied to lift-off upper cap layer 175 is selective to the source/drain material applied so that the the material comprising the source and drain electrodes is not removed from TFT assembly 100. In the embodiment of this invention in which source and drain electrodes comprise a two layer arrangement (an underlying doped semiconductive material and an overlying metallic conductive material), the metallic conductive material layer 190 preferably comprises molybdenum (Mo), as it does not etch in HCl. Alternatively, tungsten (W), nickel-chromium (NiCr), tantalum (Ta), and aluminum (Al) can be used to form metallic conductive layer 190, as these materials provide good electrical contact to the n+doped silicon without damaging the electrical junction between the n+Si and the underlying amorphous silicon while providing sufficiently low lateral resistance for the source and drain electrodes.

Intermediate body layer 165 is then removed from TFT assembly 100 to complete the fabrication of the TFT. The PI intermediate body layer is removed by, for example, etching assembly 100 in an oxygen plasma, which leaves the base layer 155 and the self-aligned source and drain electrodes.

The array of which TFT assembly 100 is a part is then completed in accordance with known procedures, such as by patterning the source drain material to form the desired address lines and contacts to active areas of the pixel, and the excess n+Si and amorphous silicon is removed in regions not covered by the source drain material.

In one alternative embodiment of this invention, metallic conductive layer 190 comprises chromium (Cr), which is known to react with n+Si to form a chromium-silicide, following an annealing step at about 200° C., between the n+Si and the Cr layer. Etching TFT assembly 100 in a solution of HCl after the deposition of the Cr layer serves to etch the Cr in addition to the ITO, and thus any portion of the ITO covered by the Cr, particularly at the ITO/PI interface, is more quickly exposed to the HCl etchant. Especially at the ITO/PI interface, removing the Cr can lessen the overall etch time to effect the lift-off of upper cap layer 175. The remaining n+Si with overlying silicide layer typically provides sufficiently low source/drain electrode lateral resistance for TFT operation.

A further embodiment of the present invention obviates the need for the deposition of metallic conductive layer 190. In this embodiment, it is preferable that doped semiconductive layer 180 comprise microcrystalline n+silicon, which will provide sufficiently low source/drain electrode lateral resistance for TFT operation. This method in which no separate metallic conductive layer 190 is deposited provides the opportunity for shorter etch times as the HCl etchant applied to effect the lift-off, as described above, can more quickly breach any thin covering of the n+material to gain access to the ITO/PI interface portion of the TFT assembly.

In either of the alternative embodiments of the method of the present invention described above, conductive metal access electrodes are typically fabricated to connect the source and drain electrodes in a TFT assembly to an address line or active pixel area, respectively, outside of the gate region. As such metal contacts to the source and drain electrode are outside of the TFT channel region, alignment is not critical (as it is with determining source and drain electrode placement in the channel region) and these metal contacts can be fabricated using conventional photolithographic techniques.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of fabricating a self-aligned thin film transistor (TFT) assembly on a substrate, comprising the steps of:

forming a multi-tiered island on a layer of semiconductor material overlying a gate electrode, said multi-tiered island comprising an upper cap layer comprising a substantially optically transparent conducting oxide and having a lateral dimension corresponding to said gate electrode as determined by a back-side exposure technique, an intermediate body layer comprising a substantially transparent organic dielectric material, and a base layer comprising an inorganic dielectric material, said base layer of said multi-tiered island having a lateral dimension less than the corresponding lateral dimension of the overlying upper cap layer and being disposed on said semiconductor layer over said gate electrode such that said lateral dimension of said base layer determines a respective overlap distance of a source and a drain electrode with respect to said gate electrode;

forming source and drain electrodes having said respective overlap of said gate electrode; and removing said upper cap layer with a lift-off technique and removing said intermediate body layer from said multi-tiered island such that said base layer remains disposed between the patterned source and drain electrodes.

2. The method of claim 1 wherein the step of forming said multi-tiered island further comprises the steps of:

depositing a layer of inorganic dielectric material over said layer of semiconductive material;

depositing a layer of substantially optically transparent organic dielectric material over said inorganic dielectric material;

depositing a layer of substantially transparent conducting oxide over said inorganic dielectric material layer; and patterning said substantially transparent conducting oxide layer with a through-the-substrate exposure technique to form said upper cap layer, said upper cap layer having dimensions corresponding to the dimensions of said gate electrode.

3. The method of claim 2 wherein the step of forming said multi-tiered island further comprises the steps of etching said organic dielectric layer to form said intermediate body layer, said intermediate body layer underlying said upper cap layer such that lip portions of said upper cap layer overhang said intermediate body layer by between about 0.5 μm to 1.5 μm.

4. The method of claim 3 wherein the step of forming said multi-tiered island further comprises the step of etching said inorganic dielectric material layer to form said base layer, said intermediate body layer comprising a mask for the etching of said inorganic dielectric material layer.

5. The method of claim 4 wherein the step of forming said source and drain electrodes comprises the steps of depositing a layer of doped semiconductor material over said assembly such that substantially no doped semiconductive material adheres to the exposed interface of said upper cap layer and said intermediate body layer.

6. The method of claim 5 wherein the step of removing said upper cap layer from said multi-tiered island comprises etching said assembly in an etchant selective to the source and drain electrode material, said etchant being applied so as to be exposed to the underside of said lip of said upper cap layer.

7. The method of claim 5 wherein the step of forming said source and drain electrodes further comprises the steps of depositing a layer of metallic conductive material over said doped semiconductor material.

8. The method of claim 7 wherein the step of removing said upper cap layer comprises etching said assembly with an etchant comprising hydrochloric acid (HCI), said HCI etchant being applied to the interface of said upper cap layer and said intermediate body layer.

9. The method of claim 8 wherein said doped semiconductor material layer comprises silicon doped to exhibit n+ conductivity and said metallic conductive material layer comprises a metal selected from the group comprising molybdenum, nickel-chromium, tantalum, and aluminium.

10. The method of claim 5 wherein said layer of substantially optically transparent inorganic dielectric material comprises silicon nitride.

11. The method of claim 10 wherein said layer of substantially optically transparent organic dielectric material comprises polyimide.

12. The method of claim 11 wherein said substantially transparent conducting oxide layer comprises a material selected from the group comprising indium tin oxide and zinc oxide.

13. The method of claim 12 wherein the step of removing said upper cap layer comprises the step of exposing said assembly to an etchant selective to the upper layer of the source/drain electrode material, said etchant comprising hydrochloric acid (HCI).

14. The method of claim 13 wherein the step of forming said upper cap layer comprises the steps of depositing a layer of photoresist over said transparent conducting oxide layer, exposing said assembly to actinic radiation emanating from a source disposed on the side of said gate electrode opposite said photoresist so as to expose a portion of said photoresist outside of the shadow of said gate, and developing said photoresist to remove portions exposed to said actinic radiation.

15. The method of claim 14 wherein the step of forming said intermediate body layer in said polyimide comprises exposing said assembly to an oxygen plasma etch for an etch time, said time being selected to generate the desired undercut of said polyimide intermediate body under the lip of said upper cap layer.

16. A method for fabricating a self-aligned thin film transistor (TFT) comprising the steps of:
forming a gate electrode on a substrate;
depositing a gate dielectric layer over said gate electrode and said substrate;
depositing a semiconductive layer over said gate dielectric layer;
forming a multi-tier island on said semiconductive layer disposed over said gate electrode, said multi-tier island comprising an inorganic dielectric base layer disposed on said semiconductive layer, a polyimide intermediate body layer disposed over said base layer, and an indium tin oxide upper cap disposed over said intermediate body layer and having a lateral dimension corresponding to said gate electrode as determined by a back-side exposure technique, said base layer of said multi-tiered island having a lateral dimension less than the corresponding lateral dimension of the overlying upper cap layer and being disposed on said semiconductor layer over said gate electrode such that said lateral dimension of sale base layer determines a respective overlap distance of a source and a drain electrode with respect to said gate electrode, said upper cap layer having a lip extending between 0.5 $\mu$m and 1.5 $\mu$m over said intermediate body layer;
forming source and drain electrodes having said respective overlap of said gate electrode;
removing said upper cap layer from said multi-tiered island with a lift-off technique; and
removing said intermediate body layer from said multi-tiered island.

17. The method of claim 16 wherein the step of forming said source and drain electrodes comprises depositing at least one respective electrode material such that said respective electrode material is disposed over said semiconductor layer up to said base portion: of said multi-tiered island and disposed over the upper surface of said upper cap layer, said respective electrode material being deposited such that at least a portion of the underside of said upper cap layer lip remains free of said respective electrode material.

18. The method of claim 17 wherein the step of removing said upper cap layer with a lift-off technique comprises exposing the TFT structure to an etchant respective to said selected electrode material such that said etchant is exposed to said upper cap layer at the underside of said upper cap layer lip that remains free of said respective electrode material.

19. The method of claim 18 wherein said respective electrode material comprises n+doped microcrystalline silicon.

20. The method of claim 18 wherein the step of forming said source and drain electrodes comprises the steps of depositing a layer of n+doped silicon and depositing a layer of chromium thereover such that said doped silicon and said chromium react to form a silicide layer therebetween.

21. The method of claim 20 wherein the step of removing said upper cap layer comprises etching the TFT assembly with an etchant comprising hydrochloric acid (HCI) so as to remove said chromium and said upper cap layer.

22. The method of claim 18 wherein the step of forming said source and drain electrodes comprises the steps of depositing a layer of n+doped silicon and depositing a layer of metallic conductive material thereover.

23. The method of claim 22 wherein said metallic conductive material comprises a metal selected from the group comprising molybdenum, nickel-chromium, tantalum, and aluminium.

24. The method of claim 23 wherein the step of removing said upper cap layer comprises the step of exposing the TFT assembly to an etchant selective to said metallic conductive material of said source and drain electrodes, said etchant comprising hydrochloric acid (HCl).

25. The method of claim 18 wherein the step of removing said intermediate body layer comprises etching the TFT assembly in an oxygen plasma.

* * * * *